United States Patent
Shi et al.

(10) Patent No.: US 9,437,793 B2
(45) Date of Patent: Sep. 6, 2016

(54) PACKAGE SUPPORT, FABRICATION METHOD AND LED PACKAGE

(71) Applicant: XIAMEN SANAN OPTOELECTRONICS TECHNOLOGY CO., LTD., Xiamen (CN)

(72) Inventors: Jun-Peng Shi, Xiamen (CN); Pei-Song Cai, Xiamen (CN); Hao Huang, Xiamen (CN); Xing-Hua Liang, Xiamen (CN); Zhen-Duan Lin, Xiamen (CN); Chih-Wei Chao, Xiamen (CN); Chen-Ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/606,038

(22) Filed: Jan. 27, 2015

(65) Prior Publication Data

US 2015/0243863 A1 Aug. 27, 2015

(30) Foreign Application Priority Data

Feb. 21, 2014 (CN) .................... 2014 2 0075500 U
Nov. 19, 2014 (CN) .................... 2014 2 0695174 U
Dec. 23, 2014 (CN) .................... 2014 2 0822588 U

(51) Int. Cl.
*H01L 33/62* (2010.01)
*H01L 33/48* (2010.01)

(52) U.S. Cl.
CPC ............. *H01L 33/62* (2013.01); *H01L 33/486* (2013.01); *H01L 2924/12041* (2013.01)

(58) Field of Classification Search
CPC .................... H01L 33/62; H01L 2924/12041; H01L 33/486; C23F 1/00
See application file for complete search history.

(56) References Cited

U.S. PATENT DOCUMENTS

2014/0117403 A1* 5/2014 Hayashi .................. H01L 33/62 257/99

* cited by examiner

*Primary Examiner* — Roy Potter
(74) *Attorney, Agent, or Firm* — Syncoda LLC; Feng Ma; Junjie Feng

(57) ABSTRACT

A package support including: metal frames connected together; one or more dielectric materials disposed in an inner gap of the metal frames; wherein: the package support has a frame region and a function region; wherein the function region has complete upper and lower surfaces configured to prevent leakage if at least one of the entire upper or lower surfaces is covered with an encapsulant material. A fabrication method allows for manufacturing the package support with a high cell density, relatively low price, high reflectivity, good heat dissipation, and high reliability. The LED package using the package support has a smaller size and improved dissipation properties.

18 Claims, 22 Drawing Sheets

PACKAGE SUPPORT, FABRICATION METHOD AND LED PACKAGE

CROSS-REFERENCE TO RELATED APPLICATIONS

The present application is a continuation of and claims priority to Chinese Patent Application Nos. CN 201420075500.7 filed on Feb. 21, 2014, CN 201420695174.X filed on Nov. 19, 2014, and CN 201420822588.4 filed on Dec. 23, 2014. The disclosures of these applications are hereby incorporated by reference in their entirety.

BACKGROUND

Light Emitting Diode (LED) is a semiconductor light-emitting device fabricated by employing P-N junction electroluminescence principles. Advantageous in environmental protection, high luminance, low power consumption, long service life, low working voltage and easy integration, the LED is the fourth-generation new light source following incandescent lamp, fluorescent lamp and high intensity discharge lamp (HID) (e.g., HPSL and metal halide lamp).

SUMMARY

Existing LED package supports have low cell density (only 200-300 cells per support), which wastes material and reduces production efficiency; the holes at the support also impede advanced technologies such as Molding. In addition, the large support cell area is to the disadvantage of luminous efficiency improvement and convenient optical design. Therefore, a new support is needed for LED package to solve the above problems.

Each cell of the existing support is much larger than the chip, leading to increased consumption of phosphor and package encapsulant by the LED package structure. After the scattering of emitted light and the phosphor, the packaged body has increased consumption. Therefore, it may be necessary to make certain improvements to the existing LED package structure that impedes the shrinkage of the sizes.

To solve the above problems, the present disclosure provides a package support, fabrication method and LED package, wherein, the package support has such features as high cell density, low price, high reflectivity, good heat dissipation and high reliability. The LED package has smaller size and better heat dissipation.

According to a first aspect of the present disclosure, a package support having metal frameworks or frames connected and an inner gap filled with dielectric material. The package support has a frame region and a function region. The function region has complete upper and lower surface with no penetrating holes, which prevents leakage when the entire surface is covered with encapsulant material.

Preferably, the metal framework forms a buckle at vertical direction with the dielectric material.

Preferably, the support thickness is less than 0.5 mm.

Preferably, the metal framework is at least two-layer structure and the surface is high-reflectivity material.

Preferably, the metal framework is high-thermal conductivity material, at least comprising one of Cu and Al. More preferably, the metal material is an at least two-layer structure and the surface is high-thermal conductivity material, at least comprising one of Ag and Al.

Preferably, the metal framework comprises a front framework and a back framework. The front framework is vertically stacked with the back framework. The back framework is connected and the area is larger than the front framework.

Preferably, the dielectric material is thermosetting plastic, at least comprising one of SMC, EMC and Polyester. More preferably, the dielectric material is black EMC material and the upper surface is covered with highly reflective insulation layer. The highly reflective insulation layer's reflectivity to 450 nm wavelength light is more than 90%.

Preferably, the dielectric material has two-layer structure, in which, the bottom layer is black plastic and the top layer is white plastic.

Preferably, the package support comprises at least one function region. More preferably, to enhance structure strength, the support is divided into different function regions, which are separately from each other by metal.

Preferably, the dielectric materials in each function region are connected.

Preferably, the function region has a series of tightly-arranged cells (at least 500 cells). In some embodiments, each cell area in the function region is not more than 9 mm$^2$; in some embodiments, the upper surface of each cell is square; in some embodiments, each cell has two metal blocks of equal size as the metal framework. The two metal blocks have no metal connection inside the cell.

Preferably, the frame region has alignment marks and air discharge ducts for half etching cutting.

Preferably, the frame region has a positioning hole.

According to a second aspect of the present disclosure, a package support having metal frameworks connected and an inner gap filled with dielectric material. The metal framework is a multi-layer structure, each layer having different patterns.

Preferably, the metal framework is an at least two-layer structure. The areas of dielectric materials decrease layer by layer from upper layer to bottom layer. In some preferred embodiments, the dielectric material area at bottom layer is not less than 40% of that of the upper layer.

Preferably, the metal framework is an at least two-layer structure. The dielectric material area ratio of at least two layers is between 0.4:1 and 2.5:1.

Preferably, the metal framework is an at least two-layer structure. The dielectric material area ratio of top layer and any of lower layers is between 1:2.5 and 1:0.4.

Preferably, the metal framework is an at least two-layer structure. The dielectric material area ratio of at least two layers is between 0.5 and 1.2. More preferably, at least two layers of dielectric materials are equal in size. Most preferably, dielectric material areas of all layers are equal.

Preferably, the metal framework has an upper layer and a lower layer, wherein, the dielectric material area of the lower layer is between 0.4 times and 2.5 times of that of the upper layer. In some preferred embodiments, the dielectric material area of the lower layer is between 0.5 times and 1.2 times of that of the upper layer.

Preferably, the metal framework has an upper layer and a lower layer and the dielectric material appears in "T" and "Inversed-T" shape.

Preferably, the metal framework is a three-layer structure and the dielectric material appears "H" and "Cross" shape.

According to a third aspect of the present disclosure, a fabrication method for package support, comprising: providing a metal substrate and determining the front pattern and the back pattern, in which, the back patterns are connected, and the front pattern is smaller than the back pattern; etching the front surface and the back surface of the metal substrate by two times to remove the regions beyond the front pattern and the back pattern; forming gap inside the metal substrate to form a metal framework; filling in dielectric material in the gap, wherein, the metal framework is parallel with the upper surface of the dielectric material.

The above package support has high cell density and efficiently saves package material; besides, it is easy for light emitting and improves lighting effect; due to small and thin cell, the support has good heat dissipation with application of material like Cu; the function region of the support is free of penetrable holes and the buckle structure is arranged between the metal and the dielectric material, preventing from leakage and facilitating the application of advanced technologies like Molding.

According to a fourth aspect of the present invention, a LED package, comprising a substrate with complete front and back surfaces, comprising at least two metal blocks and an insulation part, wherein, the metal blocks are inlaid in the insulation part and expose part of upper and lower surfaces. An electrical insulation region is set between the metal blocks; a LED chip over the metal block of the substrate and forms electrical connection with at least two metal blocks; and package encapsulant covering over the LED chip surface and part of the substrate. In this technical proposal, the LED package substrate is the package support.

Preferably, the metal block has projected connection parts that extend to the substrate edge.

Preferably, the substrate has at least two metal blocks for electric conduction and heat dissipation. Each metal block has at least three projected connection parts. In some embodiments, two metal blocks are axial symmetric.

Preferably, the metal block has at least one projected connection part appearing in angle of inclination with the metal block. In some embodiments, two metal blocks are rotational symmetric at 180°.

Preferably, the electrical insulation region between metal blocks appears in "I" or "H" shape.

Preferably, the electrical insulation region between metal blocks appears in "S" or inverted-"S" shape.

Preferably, the metal block forms bucket with the insulation part at vertical direction.

Preferably, in the substrate, divide the metal blocks into an upper part and a lower part at vertical direction, wherein, the upper part is the front surface of the substrate and the lower part is the back surface of the substrate. The upper part and the lower part have different shapes. In some embodiments, some part of the upper part of the metal block horizontally projects towards the lower part and some part of the lower part of the metal block horizontally projects towards the upper part. In some embodiments, the projected connection part is at the upper part or the lower part of the metal block.

Preferably, the package encapsulant is 0.2-5 mm thick. In some embodiments, the package encapsulant is 0.2-3 mm thick; in some embodiments, to enlarge the light-emitting angle of the package, the package encapsulant is thicken (preferably: 0.5-5 mm)

In some embodiments, to further enlarge the light-emitting angle of the package, the light-emitting surface side of the package encapsulant has an arc shape.

Preferably, the LED package also comprises a wavelength conversion device, which directly adds phosphor in the package encapsulant or directly sets the wavelength conversion material layer over the LED chip surface/package encapsulant surface.

The upper and lower surfaces of the LED package substrate are flat surfaces. The LED chip is directly located at the metal block of the substrate. Through the electric conduction and heat dissipation of the metal block, the heat dissipation of the package is improved. Wider light-emitting angle and higher light-emitting efficiency are achieved for the light will not be blocked by the support (e.g., bowl cup) side wall; the metal block of the substrate is inlaid in the insulation part. The upper and lower parts of each metal block are different in shape, forming a bucket structure with the insulation part, which improves the soundness of the package. Further, the package support is a multi-layer structure, each layer having different patterns. The support warping can be solved by designing the area ratio of dielectric materials in each layer.

Figure 1:
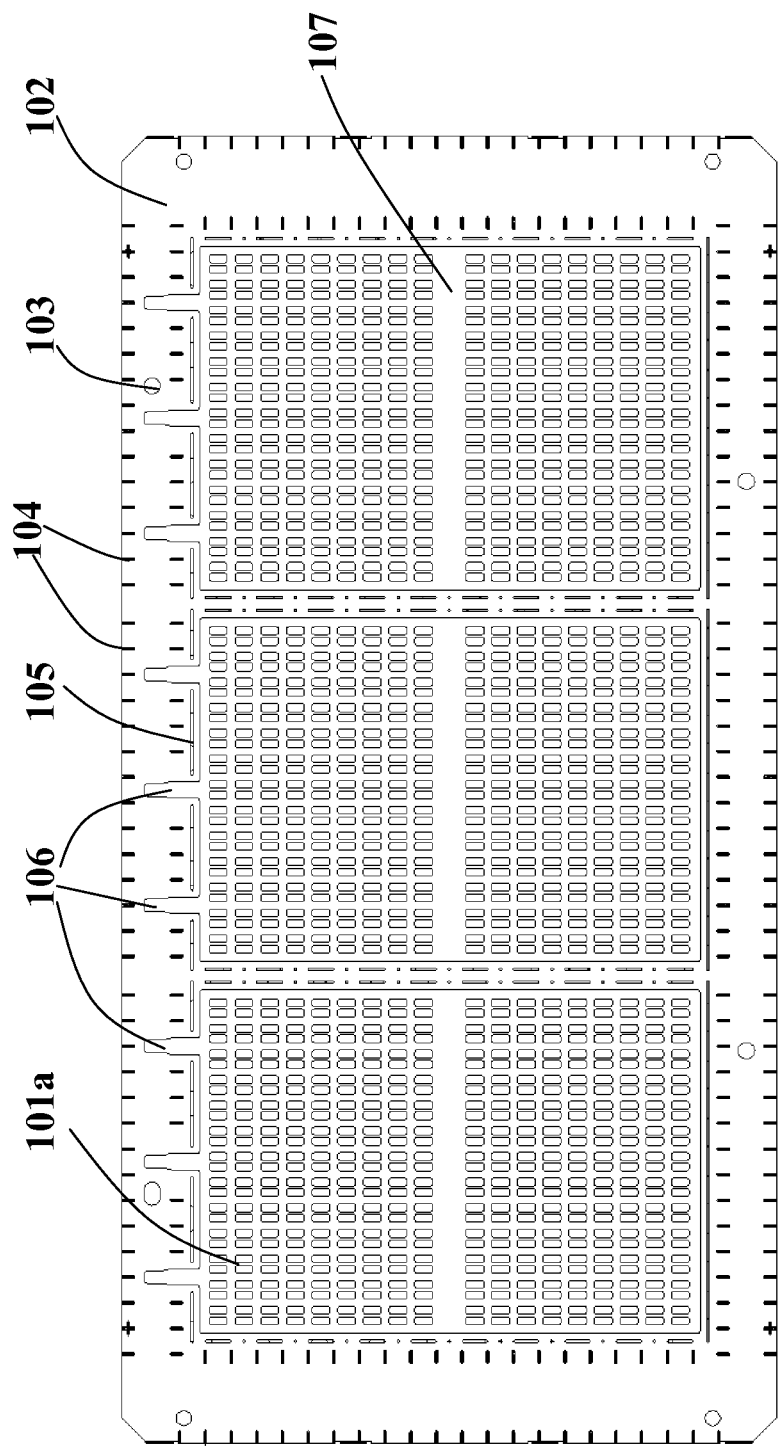
FIG. 1 is a front view of an LED package support according to some embodiments.

In the drawings: 101: support function region; 101*a*: front surface of the support function region; 101*b*: back surface of the support function region; 101-1: first function region; 101-2: second function region; 101-3: third function region; 102: support frame region; 103: positioning hole; 104: alignment mark; 105: air discharge duct; 106: filling mouth; 107: structural strength region; 110: metal framework; 110*a*: front metal framework; 110*b*: back metal framework; 120:

dielectric material; 200: any cell in the function region; 210: metal block; 220: insulation part; 221: bottom of the insulation part; 222: top layer of the insulation part; 1100: package substrate; 1110: metal block; 1110a: upper part of the metal block; 1110b: lower part of the metal block; 1111-114: projected connection part; 1120: insulation part; 1130: electrical insulation region; 1200: LED chip; 1300: package encapsulant.

DETAILED DESCRIPTION

The LED package support, fabrication method and LED package structure will be described in detail with reference to the accompanying drawings and examples, to help understand and practice the disclosed embodiments, regarding how to solve technical problems using technical approaches for achieving the technical effects.

Figure 2:
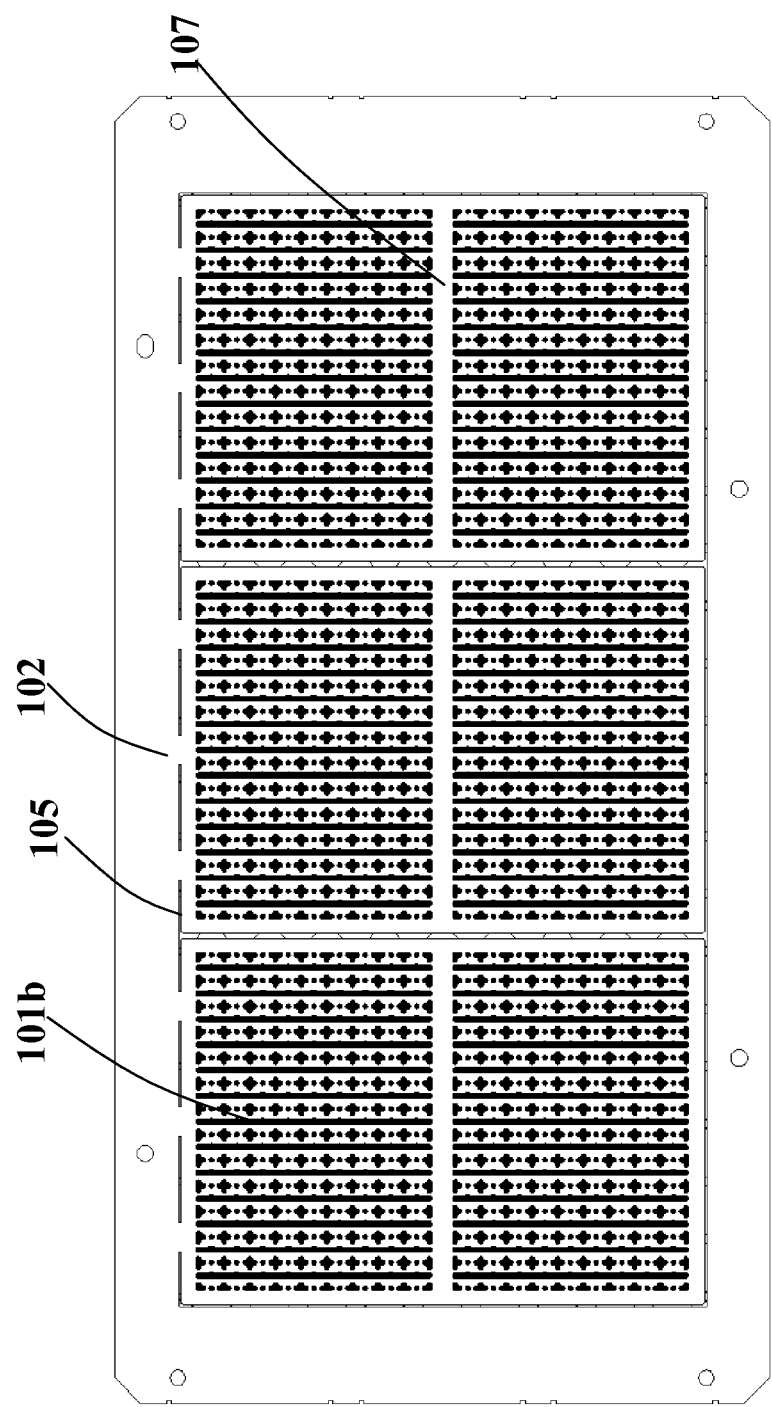
FIG. 2 is a back view of a LED package support according to some embodiments.

FIGS. 1 and 2 are front and back views, respectively, of a package support according to some embodiments. A package support comprises a function region 101 and a frame region 102. Specifically, the function region 101 has no penetrating holes, which prevents leakage when the entire surface is covered with encapsulant. It has complete front surface 101a and back surface 101b, and the patterns of the front surface 101a and the back surface 101b are different. Detailed description will be made by referring to other drawings; the frame region 102 has a positioning hole 103 and alignment marks 104. In some embodiments, the cutting mark 107 of the support appears in "Line" or "Cross" shape. The cutting mark may be approximate to or far from the function region. In some preferred embodiments, an air discharge duct 105 and a filling mouth 106 may be set. As shown in FIGS. 1-2, the function region 101 of the package support comprises three regions of same area. In some embodiments, the function region 101 can be a single region or comprise several regions. The areas of different regions can be same or different. If the function region 101 has several regions, it is preferably that each region has same area. To intensifying the support structure, a structure intensive region 107 made of metal may be arranged in the function region. Of course, in the structure intensive region 107, the front surface is conductive material and the back surface is dielectric material, or the back surface is conductive material and the front surface is dielectric material to ensure that areas of dielectric materials in the front and back surfaces are approximate so as to eliminate the support warping.

Figure 3:
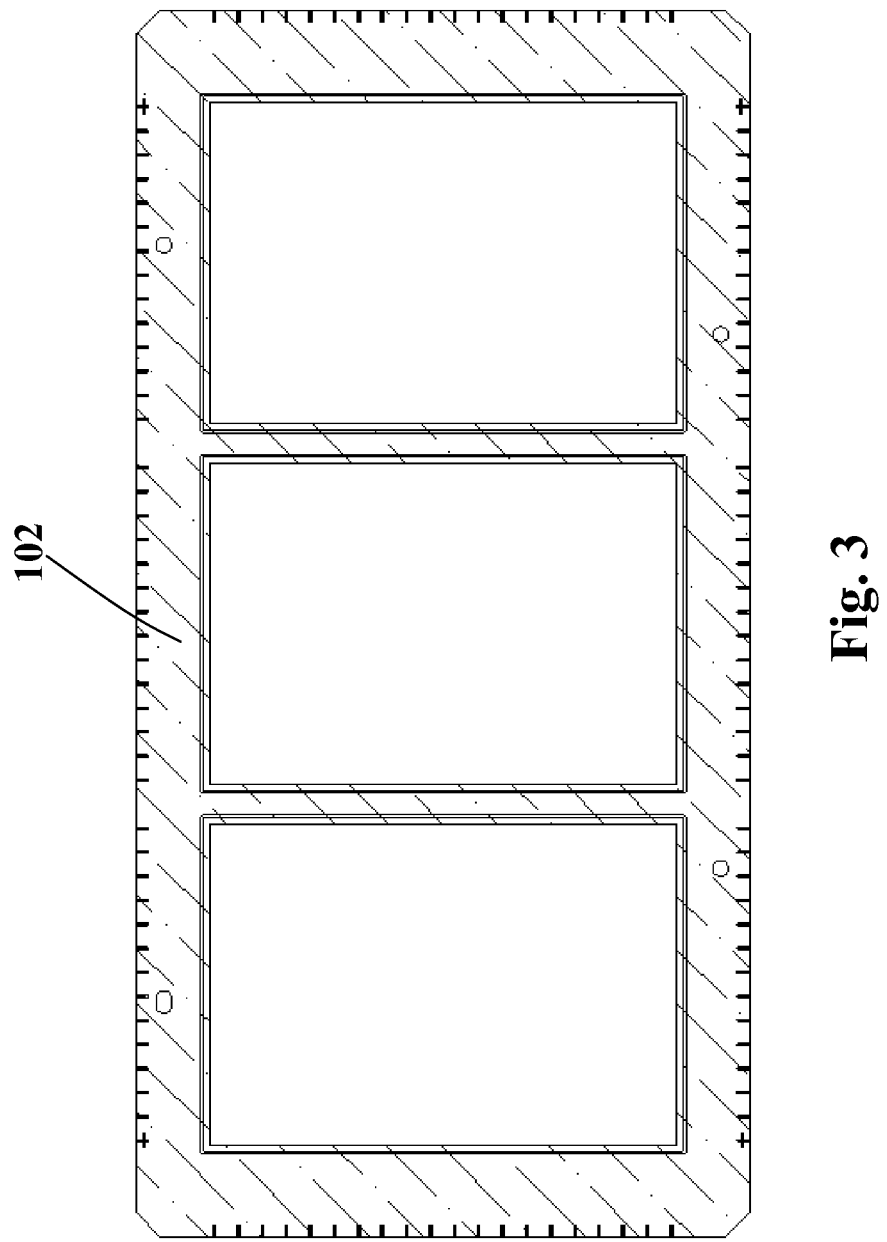
FIG. 3 is a frame region of the package support as shown in FIG. 1.
Figure 4:
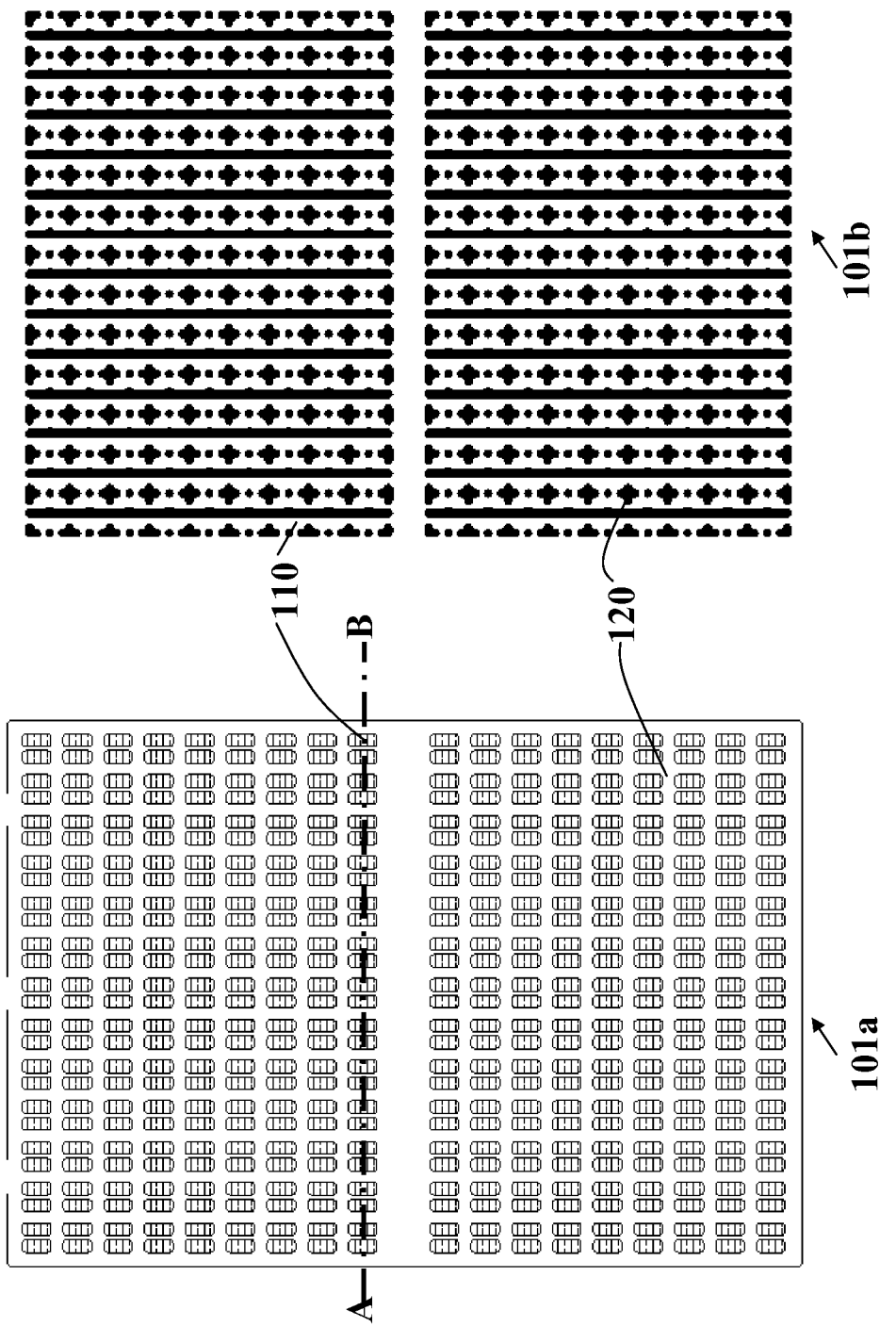
FIG. 4 is a front view and back view of frame region of the package support as shown in FIG. 1.

FIG. 3 shows the structure of the frame region 102 of the package support as shown in FIG. 1. The frame region 102 is made up of metal. FIG. 4 shows the front view and back view of a single function region of the package support. Specifically, the function region 101 has a series of tightly-arranged cells (at least 500 cells) and comprises the metal framework or frames 110 and the dielectric material 120, wherein, the metal framework 110 connects with the metal of the frame region 102 to form an entire package support frame. The pattern region 110 (filled with horizontal line as shown in the front view) is the metal framework. The white pattern region 120 is plastic. As shown in the figure, the plastics in the entire function region are connected together; in the back surface, the white pattern region 110 is the metal framework and the black pattern region 120 is plastic. As shown in the figure, the metal frameworks of the entire function region are connected together.

Figure 5:
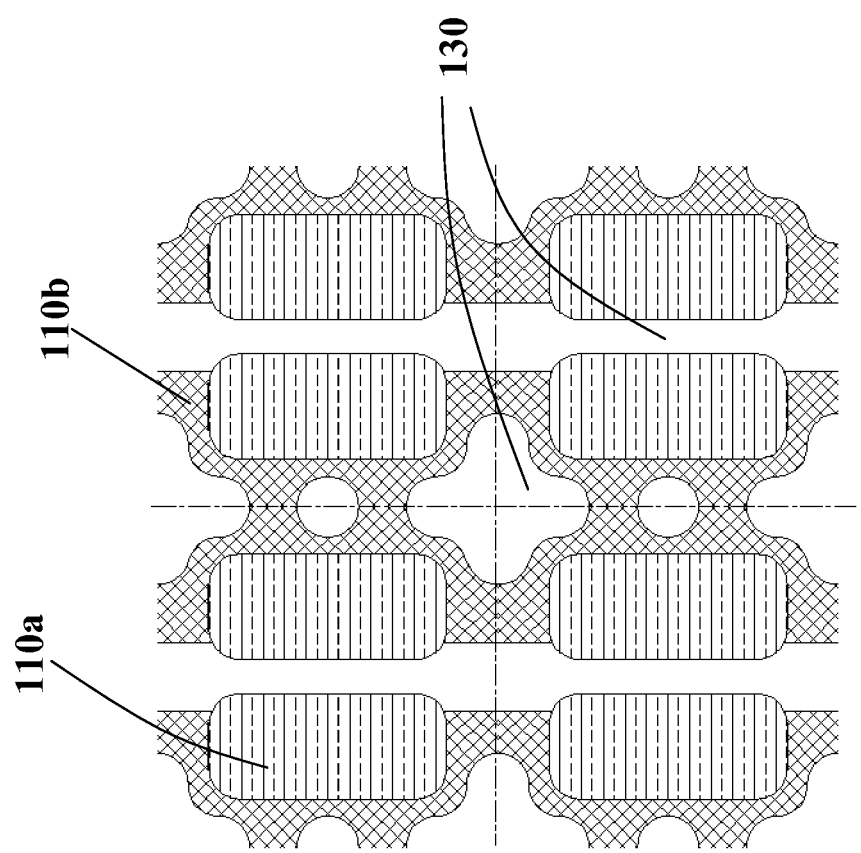
FIG. 5 is an enlarged view of the metal framework of the package support as shown in FIG. 4.
Figure 6:
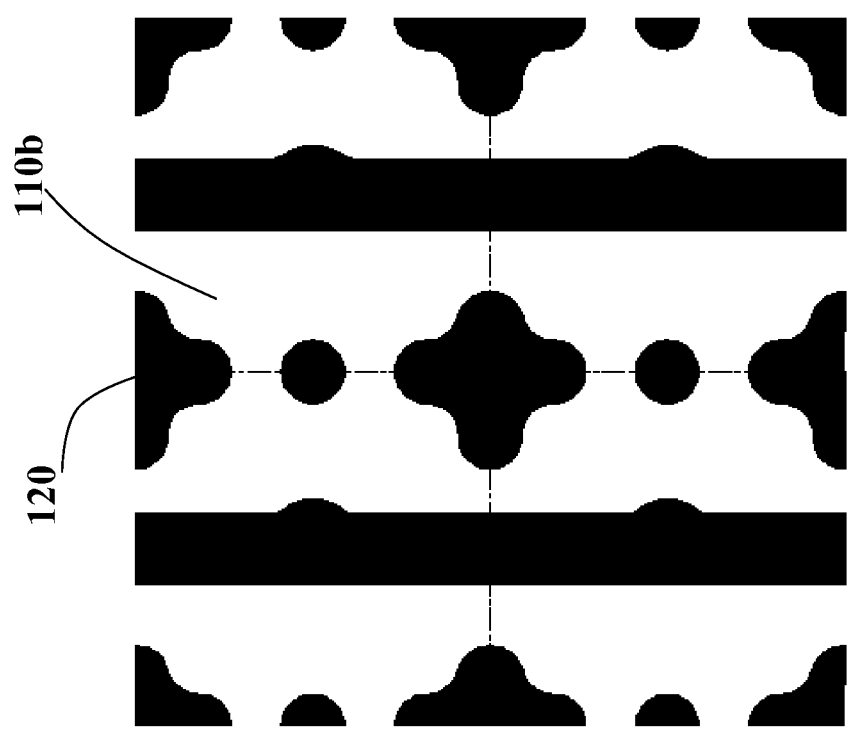
FIG. 6 is a local enlarged back view of the package support as shown in FIG. 4.

FIG. 5 is the enlarged view of the metal framework 110 of the function region 101 as shown in FIG. 4, which intercepts four cells in the function region. Specifically, the metal framework 110 comprises the front framework 110a and the back framework 110b, which are overlapped vertically, wherein, the back frameworks 110b are connected and the area is larger than that of the front framework. Inside the metal framework 110 is the gap 130. The gap is filled with the dielectric material 120. FIG. 6 is the local back enlarged view of the function region 101 as shown in FIG. 4, which also intercepts four cells in the function region. The white pattern region in the figure is the back metal framework 110b of the function region 101 (i.e., the back framework 110b as shown in FIG. 5) and the black pattern region is the dielectric material 120.

Figure 7:
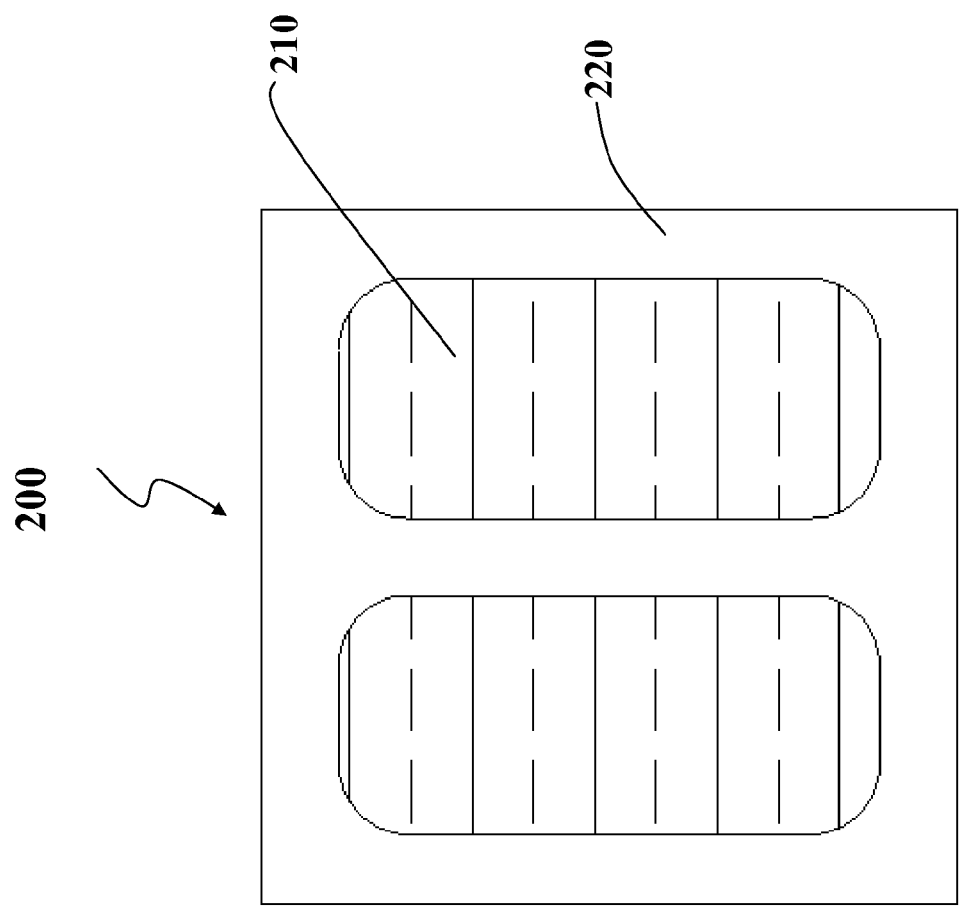
FIG. 7 is an enlarged view of any cell of the function region in the package support as shown in FIG. 4.
Figure 8:
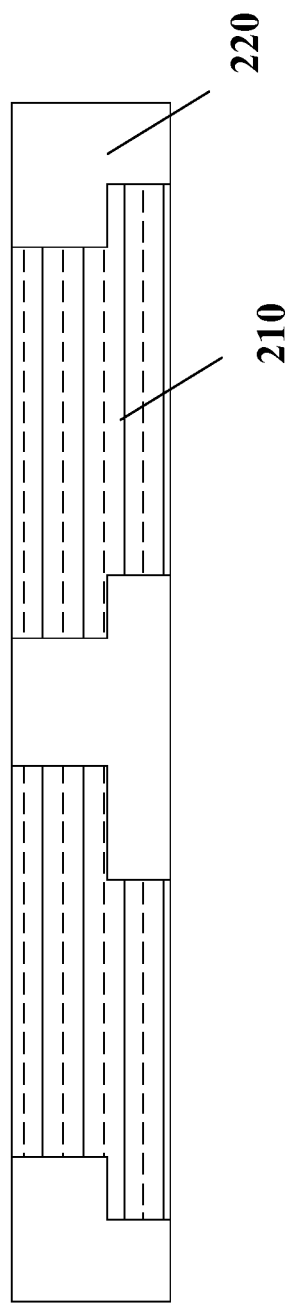
FIG. 8 is a side sectional view of a first type of cells of the package support as shown in FIG. 7.
Figure 9:
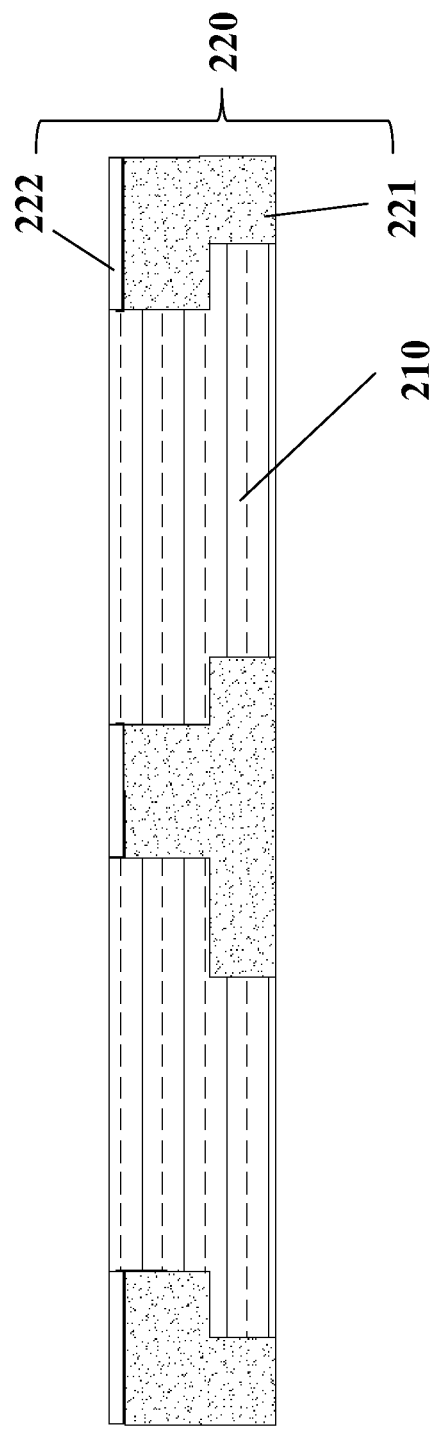
FIG. 9 is a side sectional view of a second type of cells of the package support as shown in FIG. 7.
Figure 10:
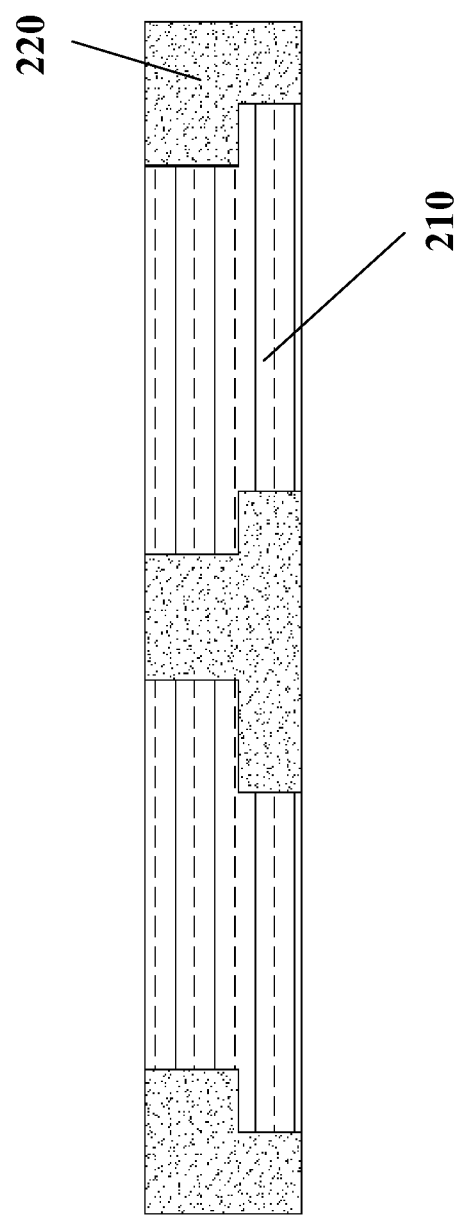
FIG. 10 is a side sectional view of a third type of cells of the package support as shown in FIG. 7.

FIG. 7 is the enlarged top view of any cell 200 of the function region 110 as shown in FIG. 4. Specifically, the cell 200 comprises two metal block 210 (i.e., the metal framework 110 as shown in FIG. 5) and the insulation part 220 (i.e., the dielectric material 120 as shown in FIG. 6). The two metal blocks 210 have no metal connection inside the cell. In some embodiments, it is preferable that the area of each cell 200 is not more than 9 mm$^2$. The upper surface of each cell is square. The metal block 210 is high-thermal conductivity material, at least comprising one of Cu and Al, which can be single-layer structure or multi-layer structure. Two-layer structure is preferred. The surface is high-thermal conductivity material, at least comprising one of Ag and Al; the insulation part 220 is thermosetting plastic, at least comprising one of SMC, EMC and Polyester. In a preferred embodiment of the present disclosure, the metal block 210 is a three-layer structure comprising silvering upper and lower copper surfaces. Only one layer is used for explanation. FIGS. 8-10 are the three side sectional structures of the cell as shown in FIG. 7. The insulation part 220 of the cell 200 as shown in FIG. 8 is a single-layer structure. The material is high reflectivity layer (reflectivity>90%), which is preferably white EMC or SMC. The insulation part 220 of the cell 200 as shown in FIG. 9 is a two-layer structure. The bottom part 221 is material with high reliability, mechanical strength and good metal adhesiveness, which is preferably black EMC, The top layer 222 is high-reflectivity and high temperature resistance material, which is preferably high-reflectivity silicone ink. The insulation part 220 of the cell 200 as shown in FIG. 10 is also a single-layer structure but the material has high reliability, preferably black EMC.

To avoid support warping, it is preferable that the areas of the dielectric material 120 at support front and the dielectric material 120 at the back surface are not so different. Specifically, the area ratio of the dielectric materials between the front and back surfaces is between 0.4:1 and 2.5:1 and more preferably, between 0.8:1 and 1.2:1. This embodiment also considers heat dissipation and warping problem of the support. The areas of dielectric materials decrease layer by layer from upper layer to bottom layer, wherein, it is preferable that the dielectric material area at bottom layer is not less than 40% of that of the upper layer. Taking the support as shown in FIG. 1 for example, the entire support is 5000 mm$^2$. The dielectric material at front surface is 2000 mm$^2$ and the dielectric material at back surface is preferably not less than 800 mm$^2$.

Figure 11:
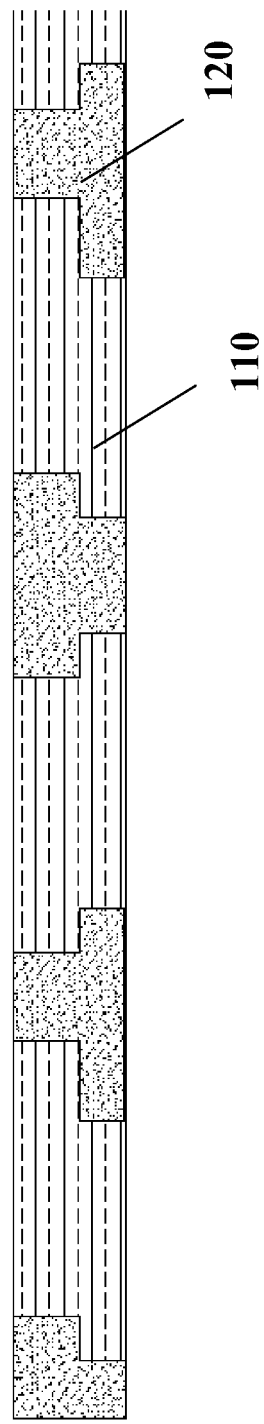
FIG. 11 is a side sectional view of a first type of the support showing only a few cells, where the profile position is the dotted line A→B in FIG. 4.
Figure 12:
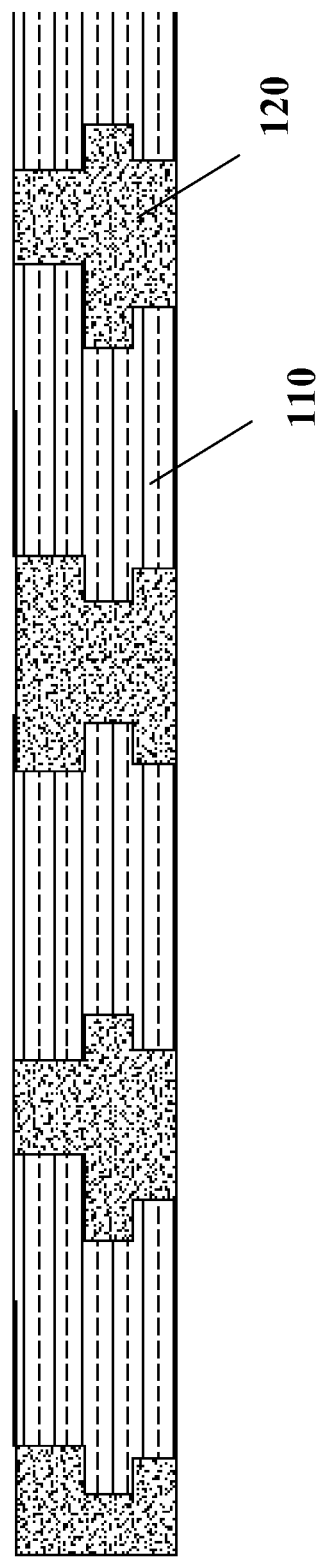
FIG. 12 is a side sectional view of a second type of the support.
Figure 13:
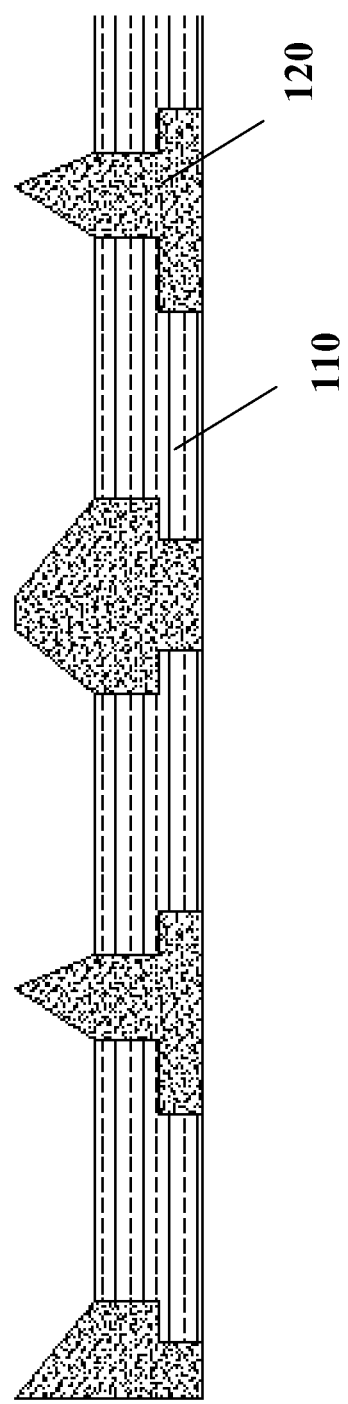
FIG. 13 is a side sectional view of a third type of the support.
Figure 14:
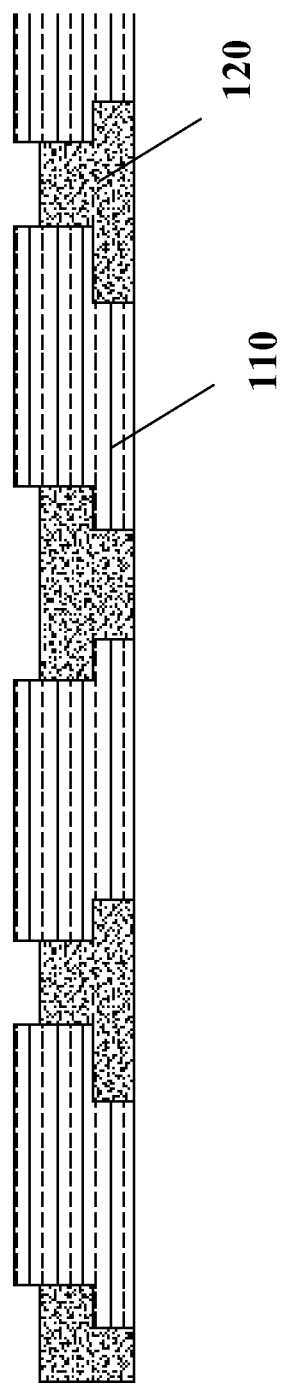
FIG. 14 is a side sectional view of a fourth type of the support.

FIGS. 11-14 are side sectional views of the supports of different types (only displaying a few cells). The profile position is the dotted line A→B in FIG. 4. Referring to FIG. 11, in consideration of approximate areas of the dielectric materials between the upper and lower layers, the dielectric material 120 appears in "T" and "Inversed-T" shape to eliminate the support warping. Referring to FIG. 12, the package support is a three-layer structure. To achieve approximate area of the dielectric materials for different layers, the dielectric material 120 appears in "H" and "Cross" shape. It is to be understood that, the dielectric materials 120 can all appear in "H" and "Cross" shape as long as the dielectric materials of the upper and lower layers are approximate to eliminate warping. Preferably, the area ratio of the dielectric materials of the middle layer and the lower layer and the dielectric material of the upper layer is between 0.4-2.5. Most preferably, the area ratio of dielectric materials for the three layers is 1:1:1. In some embodiments, the support surface may not be flat and the dielectric material may project over the surface or the metal framework may project over the surface, as shown in FIG. 13 and FIG. 14 respectively. As shown in FIG. 13, the package support has three layers, wherein, the top layer only has the dielectric material and has no metal framework, and the middle layer and the lower layer comprise the dielectric material and the metal framework. To eliminate the support warping, the dielectric materials of the middle layer and the lower layer may appear in "T" shape and "Inversed-T" shape. In consideration of the impact of the dielectric material at top layer, the dielectric material area of the middle layer may be a little smaller than that of the lower layer the dielectric material. Preferably, the area ratio is between 0.4:1 and 1:1, and most preferably, 0.8:1. FIG. 7 adopts same method. The dielectric material may appear in "T" shape and "Inversed-T" shape.

A simple description will be made for a fabrication method of the package support. A fabrication method for package support, comprising: providing a metal substrate and determining the front pattern and the back pattern, in which, the back patterns are connected, and the front pattern is smaller than the back pattern; etching the front surface and the back surface of the metal substrate by two times to remove the regions beyond the front pattern and the back pattern; forming gap inside the metal substrate to form a metal framework; filling in plastic in the gap, wherein, the metal framework is parallel with the upper surface of the plastic. Transfer molding is used for filling plastic: placing the etched metal substrate in the flat mould (the upper and lower moulds are flat die) and pressing the plastic over the metal substrate; filling plastic from the filling mouth at side of the mould until the plastic is filled up with the etched gap. After transfer molding, take out the support, and remove the burr with Deflash. Level out the plastic surface; heat the support to above flowing temperature Tf for plastic smashing. Lower the temperature to normal temperature to keep the entire support flat with no warping.

Figure 15:
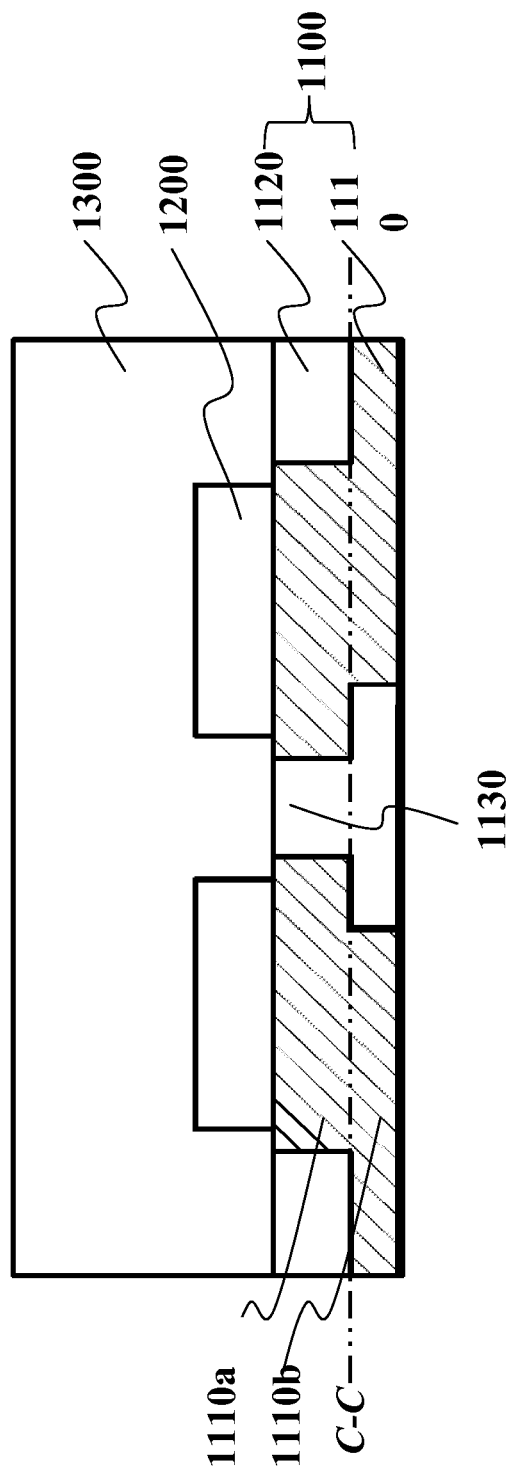
FIG. 15 is a sectional view of a first type of LED package according to some embodiments.
Figure 16:
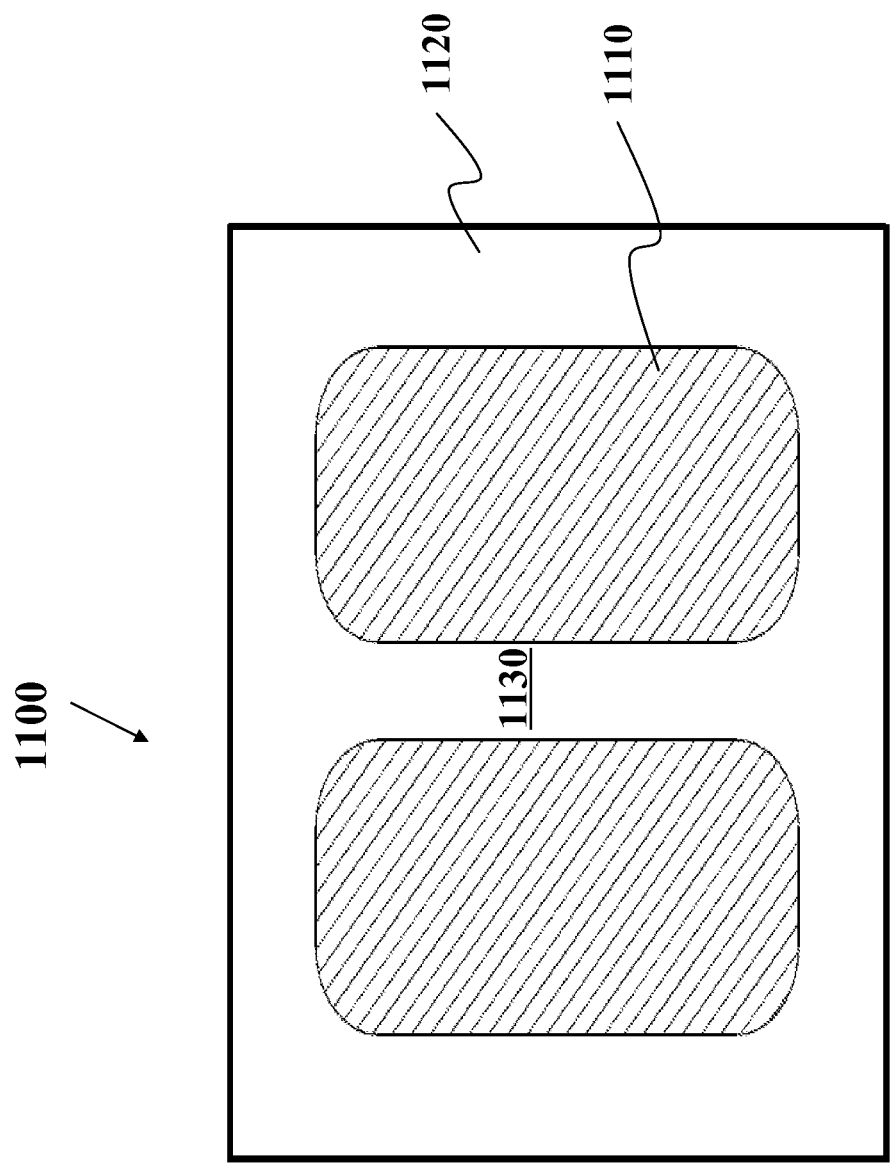
FIG. 16 illustrates the front pattern of the substrate of the LED package as shown in FIG. 15.
Figure 17:
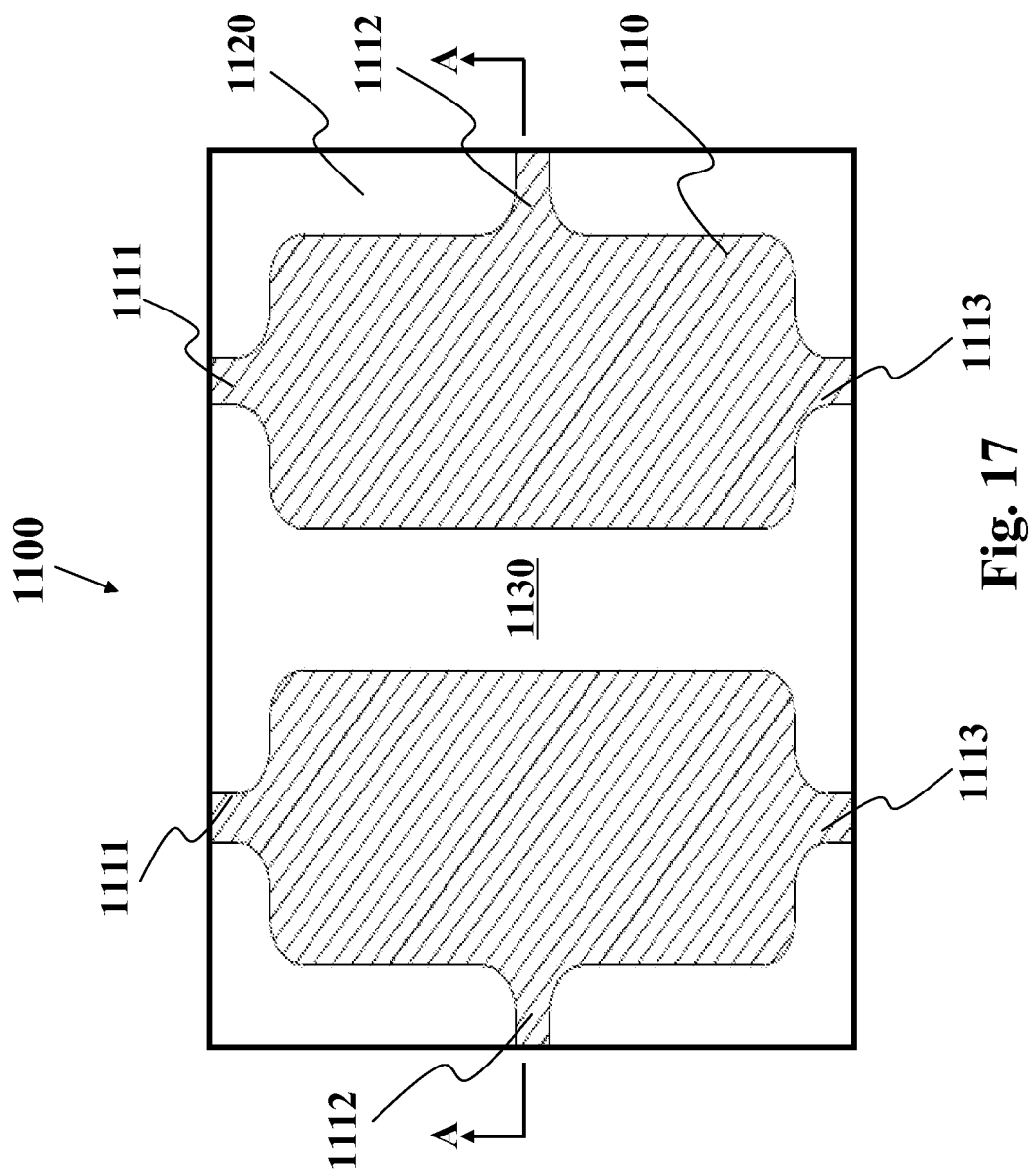
FIG. 17 illustrates the back pattern of the substrate of the LED package as shown in FIG. 15.

FIGS. 15-17 illustrate a first LED package according to some embodiments, wherein FIG. 16 and FIG. 17 are the front pattern and the back surface pattern, respectively, of the substrate of the LED package. FIG. 15 is the sectional view of the package cut along the Line A-A as shown in FIG. 17.

Referring to FIG. 15, a LED package, comprising: a substrate 1100, a LED chip 1200 and a package encapsulant 1300. The front and back surfaces of the substrate 1100 are flat and complete surfaces, comprising two metal blocks 1110 and an insulation part 1120; the metal block 1110 is inlaid in the insulation part 1120 and expose part of upper and lower surfaces. An electrical insulation region 1130 is set between the metal blocks 1110; the LED chip 1200 is over the front surface of the two metal blocks 1110 and forms electrical connection; and the package encapsulant 1300 is over the LED chip 1200 surface and over part of the substrate.

In this embodiment, the insulation part 1120 of the substrate is white plastic, or thermal plastic (e.g., PPA, PCT, LCP) or thermal setting plastic (e.g., EMC, SMC, Polyester). Specifically, plastics are filled around the metal block 1110. Upper part and lower part expose part of metal to make the metal block 1110 inlaid in the insulation part 1120. The front surface of the metal block 1110 is the LED chip die bonding platform of the function region. The two metal blocks have one LED chip each. The two chips are connected by gold thread (or silver, copper and aluminum threads) for electrical conduction. The two chips may be in series or in parallel. Referring to FIG. 15 again, taking the Reference Plane C as boundary, vertically divide the metal block 1110 into upper part 1110a and lower part 1110b of different shapes. Specifically, at the place near the electrical insulation region 1130, the upper part 1110a of the metal block horizontally projects over the lower part 1110b; and at the place near the substrate edge, the lower part 1110b of the metal block horizontally projects over the upper part 1110a, thus forming a bucket at vertical direction between the metal block 1110 and the insulation part 1120. Referring to FIG. 17, each metal block 1110 has three projected connection parts 1111, 1112 and 1113, which extend to the substrate edge. Each projected connection part is at the lower part 1110b of the metal block (in some embodiments, the projected connection part can be at the upper part of the metal block).

The package encapsulant 1300 covers the five surfaces (except the bottom) of the chip, part of the surface layer of the metal block and the plastic. The package encapsulant may comprise phosphor for wavelength conversion. The package encapsulant can be 0.2-5 mm thick.

Figure 18:
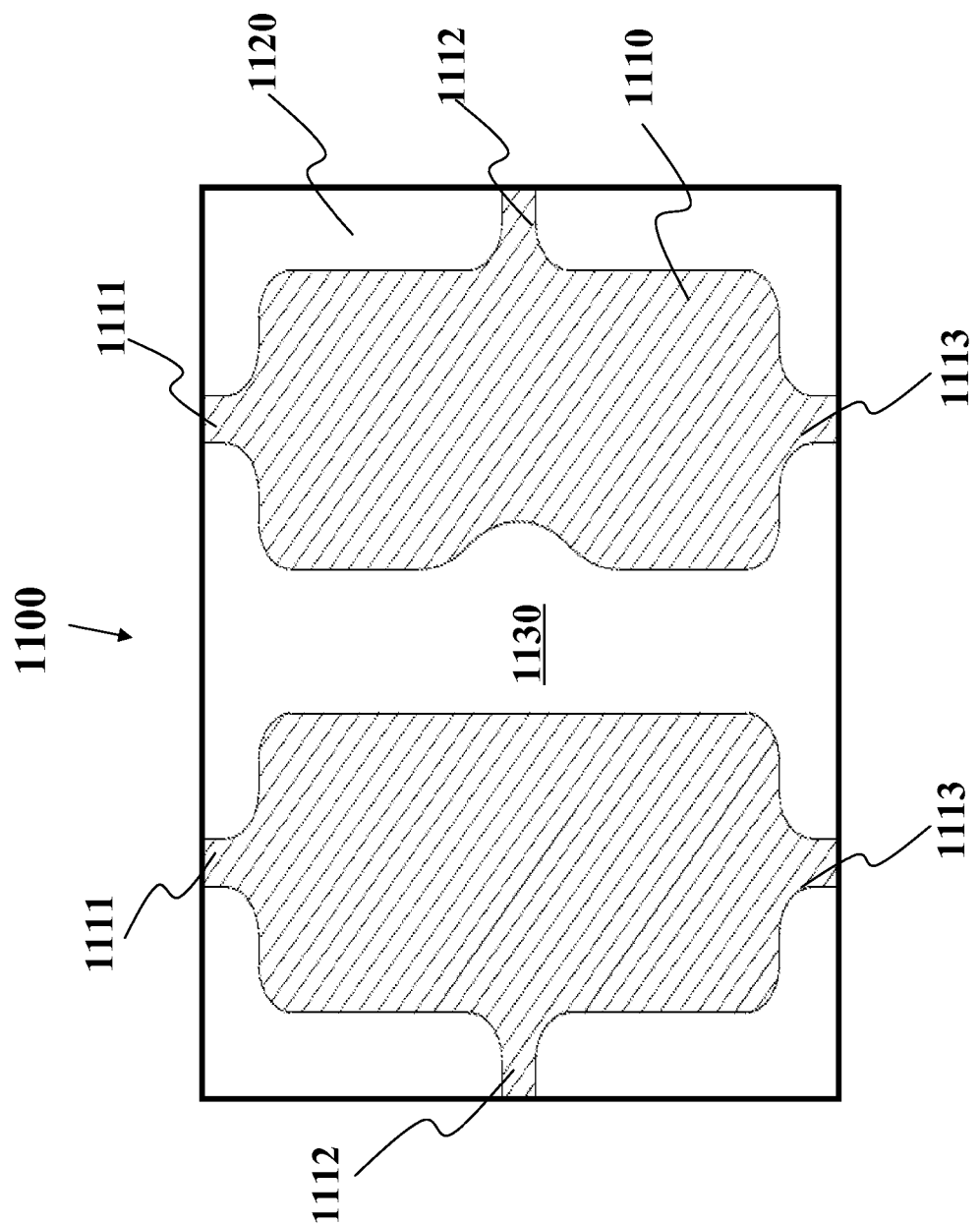
FIG. 18 illustrates a variation of the LED package as shown in FIG. 15.

In the above structure, the metal blocks 1110 are axial symmetric. The electrical insulation region between them appears in "I" shape (or "H" shape, based on the chip shape) for electrical conduction and heat dissipation, wherein, one metal block is positive pole and the other metal block is negative pole. To distinguish the positive and negative poles, the positive and negative pole marks may be formed on the back surface of the substrate. Referring to FIG. 18, an indent part may be formed at the inner side of the metal block at right to indicate it is positive (or negative).

Figure 19:
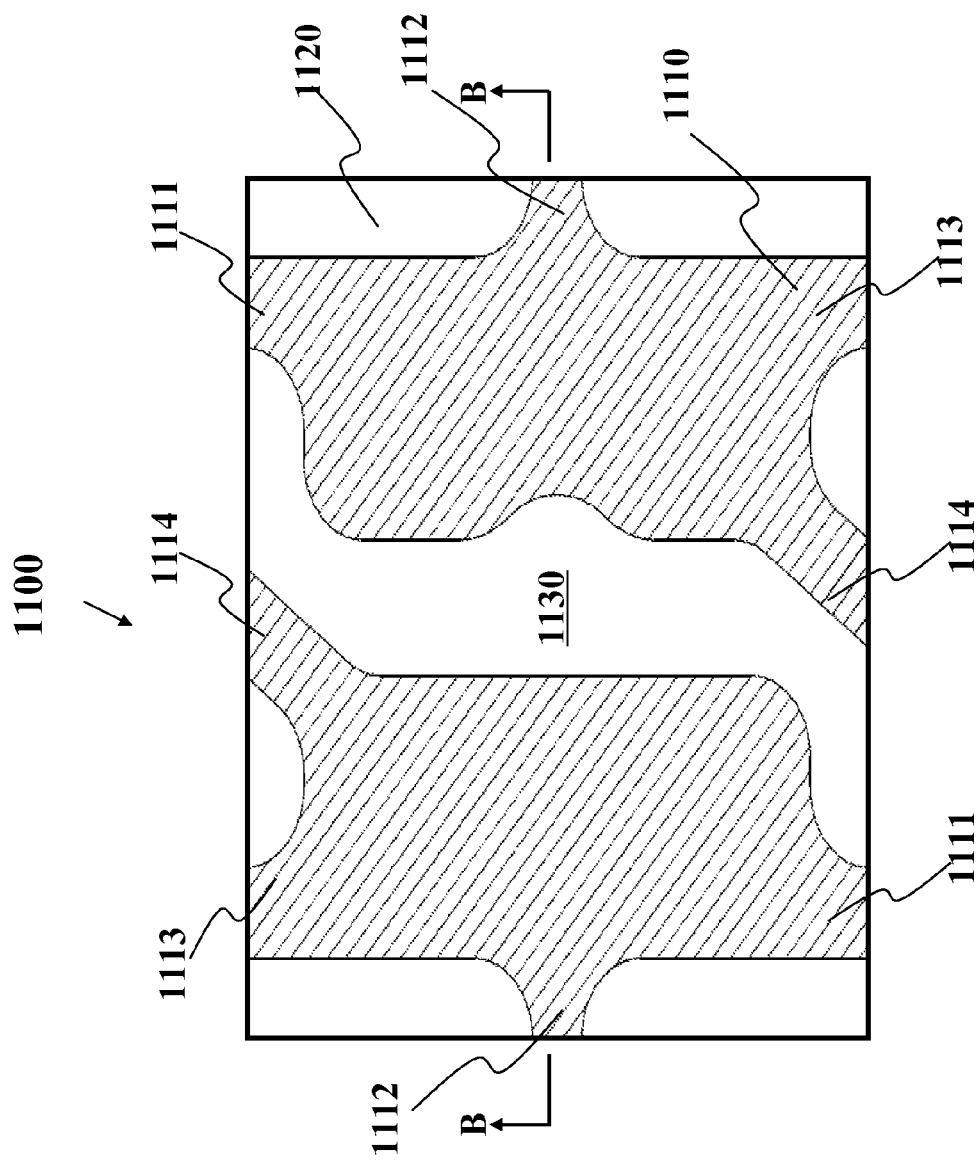
FIG. 19 illustrates the back pattern of the substrate of a second type of LED package according to some embodiments.
Figure 20:
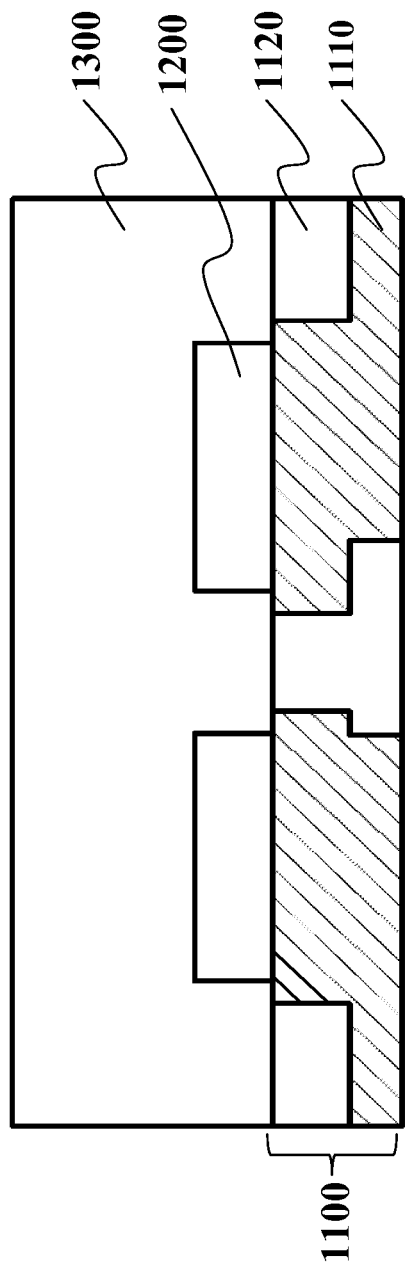
FIG. 20 is a sectional view of a second type of LED package according to some embodiments.

FIGS. 19 and 20 illustrate a second LED package according to some embodiments, wherein, FIG. 19 is the back surface pattern of the substrate of the LED package and FIG. 20 is the section view of the package cut along the Centerline B-B as shown in FIG. 19. The front pattern of the substrate is same as that in Embodiment 1.

Referring to FIG. 19, the difference between this embodiment and Embodiment 1 is that: the metal blocks are rotational symmetric at 180°. The electrical insulation region between them appears in "S" shape (or Inversed-S shape). Each metal block has four projected connection parts 1111, 1112, 1113 and 1114. Taking the metal block 1110 at left as example, the projected connection parts 1111 and 1113 are at the left of the front and back ends of the metal block, the projected part 1112 is at the middle part at the left of the metal block and the projected part 1114 is at the right part of the back of the metal block and appears in angle of inclination with the metal block. In this embodiment, the package encapsulant 1300 is 0.2-3 mm thick, which can be 1 mm.

Figure 21:
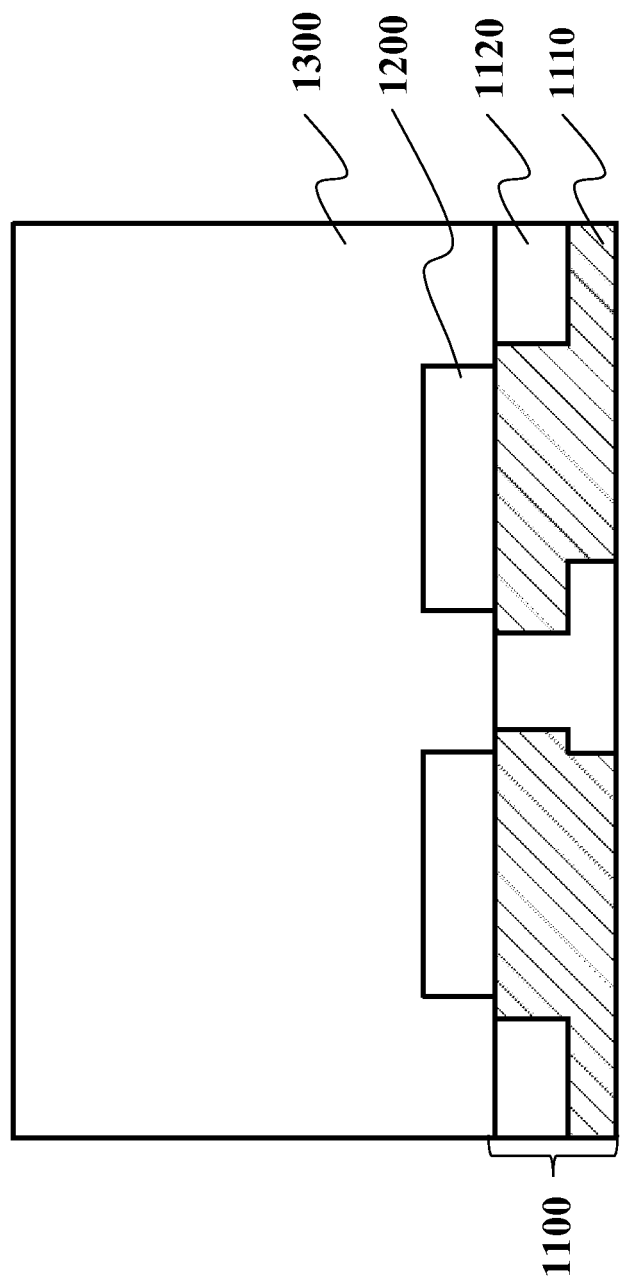
FIG. 21 illustrates a variation of the LED package as shown in FIG. 20.
Figure 22:
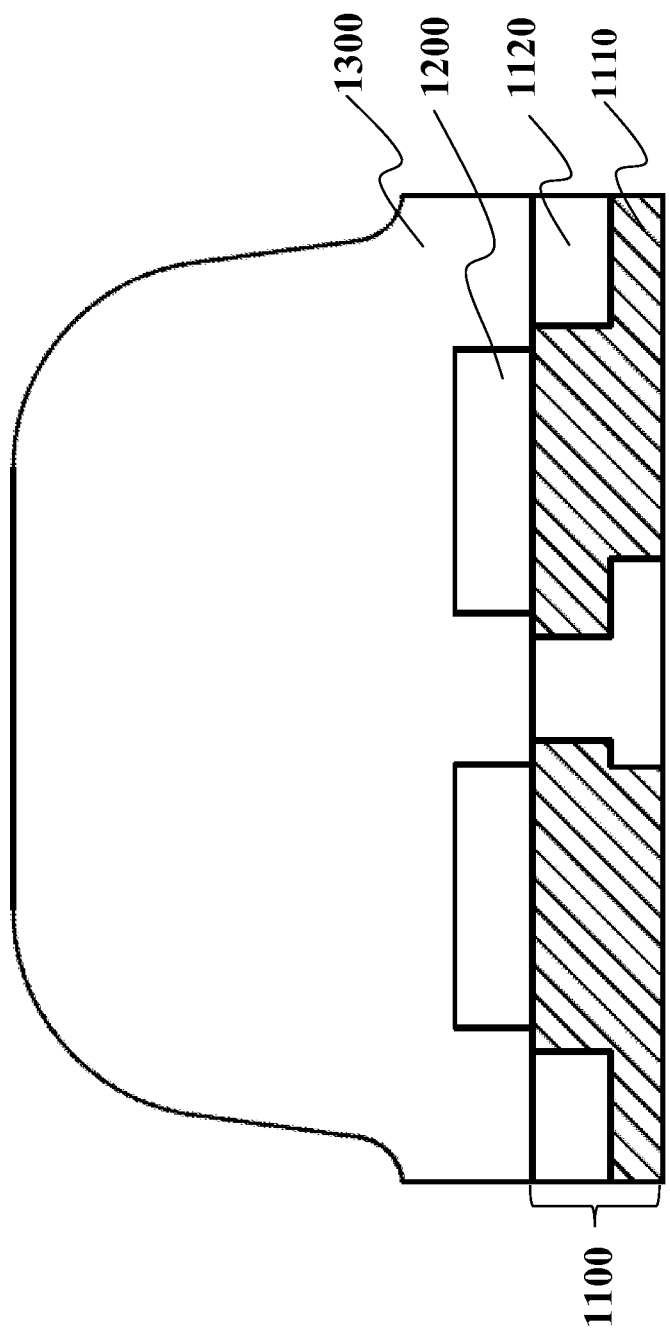
FIG. 22 illustrates another variation of the LED package as shown in FIG. 20.

Referring to FIG. 21, the thickness of the package encapsulant can be increased to enlarge the light emitting angle of the package, which is 0.5-5 mm, and preferably, 2-5 mm. Referring to FIG. 22, to further enlarge and light emitting angle of the package, the light-emitting side of the package encapsulant 1300 appears in arc shape.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A package support comprising:
   metal frames connected together;
   one or more dielectric materials disposed in an inner gap of the metal frames;
   wherein: the package support has a frame region and a function region;
   wherein the function region has complete upper and lower surfaces configured to prevent leakage if at least one of the entire upper or lower surfaces is covered with an encapsulant material;
   wherein the metal frames include front frames and back frames vertically stacked together; and
   wherein the back frames are connected together having an area lamer than an area of the front frames.

2. The package support of claim 1, wherein, the metal frames form a buckle in a direction vertical to the dielectric material.

3. The package support of claim 1, wherein the dielectric material has a two-layer structure including a bottom layer comprising black plastic and a top layer comprising white plastic.

4. The package support of claim 1, wherein the package support comprises one or more function regions separately by metal to increase a structure strength.

5. The package support of claim 1, wherein the dielectric materials in all function regions are connected, and wherein the complete upper and lower surfaces have no through holes.

6. The package support of claim 1, wherein the function region has at least 500 tightly-arranged cells.

7. The package support of claim 6, wherein each cell area in the function region has an area not more than 9 mm$^2$.

8. The package support of claim 6, wherein each cell comprises two metal blocks of an equal size as the metal frame, and wherein the two metal blocks have no metal connection inside the cell.

9. A package support comprising:
   metal frames connected together; and
   one or more dielectric material disposed in an inner gap of the metal frames;
   wherein the metal frames form a multi-layer structure with each layer having a different pattern; and
   areas of the dielectric materials decrease layer by layer from a top to a bottom.

10. The package support of claim 9, wherein the dielectric material area at the bottom layer is not less than 40% of that of the top layer.

11. The package support of claim 9, wherein at least two layers have a dielectric material area ratio between 0.4:1 and 2.5:1.

12. The package support of claim 9, wherein a dielectric material area ratio between a top layer and any lower layers is between 1:2.5 and 1:0.4.

13. The package support of claim 1, wherein, the metal frames include an upper layer and a lower layer, wherein a dielectric material area of the lower layer is between 0.4 times and 2.5 times of that of the upper layer.

14. The package support of claim 1, wherein, the metal frames include an upper layer and a lower layer, and the dielectric materials have a "T" and an "inverted-T" shape.

15. The package support of claim 1, wherein the metal frames have a three-layer structure, and wherein the dielectric materials have an "H" and a cross shape.

16. A method comprising:
    providing a metal substrate;
    determining front patterns and back patterns, wherein the back patterns are connected, and wherein the front patterns are smaller than the back patterns;
    etching a front surface and a back surface of the metal substrate respectively to remove regions other than the front patterns and the back patterns;
    forming a gap inside the metal substrate to thereby obtain form metal frames; and
    disposing a dielectric material in the gap to thereby form a package support;
    wherein, the metal frames are substantially level with an upper surface of the dielectric material.

17. The method of claim 16, further comprising:
    providing a cell of the package support as a substrate having complete front and back surfaces, the comprising at least two metal blocks and an insulation portion, wherein the metal blocks are inlaid in the insulation portion and expose at least of a portion of upper and lower surfaces;
    providing an LED chip over the metal blocks of the substrate and forming electrical connection with at least two metal blocks; and
    covering, with an encapsulant, a surface of the LED chip and a portion of the substrate to thereby form an LED package of the package support.

18. The method of claim 17, wherein the metal blocks have protrusions configured as connection parts that extend to an edge of the substrate.

* * * * *